United States Patent
Mohammadi et al.

(10) Patent No.: US 11,810,615 B2
(45) Date of Patent: Nov. 7, 2023

(54) AREA-EFFICIENT DUAL-PORT AND MULTI-PORT SRAM. AREA-EFFICIENT MEMORY CELL FOR SRAM

(71) Applicant: XENERGIC AB, Lund (SE)

(72) Inventors: Babak Mohammadi, Lund (SE); Berta Morral Escofet, Oslo (NO); Reza Meraji, Malmö (SE)

(73) Assignee: XENERGIC AB

( * ) Notice: Subject to any disclaimer, the term of this patent is extended or adjusted under 35 U.S.C. 154(b) by 266 days.

(21) Appl. No.: 17/438,574

(22) PCT Filed: Mar. 13, 2020

(86) PCT No.: PCT/EP2020/056853
§ 371 (c)(1),
(2) Date: Sep. 13, 2021

(87) PCT Pub. No.: WO2020/182983
PCT Pub. Date: Sep. 17, 2020

(65) Prior Publication Data
US 2022/0148649 A1     May 12, 2022

(30) Foreign Application Priority Data
Mar. 14, 2019   (EP) .................................... 19162791

(51) Int. Cl.
*G11C 11/412*     (2006.01)
*G11C 5/14*     (2006.01)
(Continued)

(52) U.S. Cl.
CPC ............ *G11C 11/412* (2013.01); *G11C 5/145* (2013.01); *G11C 11/418* (2013.01); *G11C 11/419* (2013.01)

(58) Field of Classification Search
CPC ..... G11C 11/412; G11C 5/145; G11C 11/418; G11C 11/419; G11C 7/12; G11C 8/08; G11C 11/417
See application file for complete search history.

(56) References Cited

U.S. PATENT DOCUMENTS 5,973,985 A    10/1999   Ferrant
6,496,432 B2 *   12/2002   Ouellette ............... G11C 29/02
                                              365/201
(Continued)

FOREIGN PATENT DOCUMENTS

EP          3096325 A1    11/2016
WO    2017045720 A1    3/2017

*Primary Examiner* — Khamdan N. Alrobaie
(74) *Attorney, Agent, or Firm* — DINSMORE & SHOHL LLP (57) ABSTRACT

A memory cell has first, second, third and fourth transistors forming first and second cross-coupled inverters. The inverters define first and inverted first storage nodes; the first connected to first reference and first supply voltages, second connected to second reference and second supply voltages. A fifth transistor connected between first storage node and first bit line; sixth transistor connected between inverted first node and second bit line; first word line connected to fifth transistor, controlling access of first bit line to first node; second word line connected to sixth transistor, controlling access of second bit line to inverted first node. Relative voltage levels of first word line and first reference voltages, or first supply and first reference voltages, or second word line and second reference voltages, or second supply and second reference voltages, or first and second reference voltages are configured so first/inverted node are read/written independently.

15 Claims, 5 Drawing Sheets

(51) Int. Cl.
*G11C 11/418* (2006.01)
*G11C 11/419* (2006.01)

(56) References Cited

U.S. PATENT DOCUMENTS

| | | |
|---|---|---|
| 7,957,177 B2 * | 6/2011 | Perisetty ............... G11C 11/413 |
| | | 365/189.02 |
| 8,164,938 B2 * | 4/2012 | Kuroda .................... G11C 8/16 |
| | | 365/72 |
| 8,238,168 B2 * | 8/2012 | Barth, Jr. ............ G11C 11/4091 |
| | | 365/185.25 |
| 8,902,672 B2 | 12/2014 | Iyer et al. |
| 9,064,556 B2 | 6/2015 | Gulati et al. |
| 9,118,689 B1 | 8/2015 | Apte et al. |
| 9,147,466 B2 | 9/2015 | Iyer et al. |
| 9,230,622 B2 | 1/2016 | Wu et al. |
| 9,496,029 B1 | 11/2016 | Moharir |
| 2007/0002617 A1 * | 1/2007 | Houston ................ H10B 10/12 |
| | | 257/E27.099 |
| 2008/0019202 A1 * | 1/2008 | Houston .................. G11C 8/08 |
| | | 365/206 |
| 2022/0148649 A1 * | 5/2022 | Mohammadi ............ G11C 7/12 |

* cited by examiner

PRIOR ART

AREA-EFFICIENT DUAL-PORT AND MULTI-PORT SRAM. AREA-EFFICIENT MEMORY CELL FOR SRAM

CROSS-REFERENCE TO RELATED APPLICATIONS

This application is the U.S. national stage of PCT/EP2020/056853 filed Mar. 13, 2020, which claims priority of European patent application 19162791.8 filed Mar. 14, 2019, both of which are hereby incorporated by reference in their entirety.

FIELD OF THE INVENTION

The present disclosure relates to an area-efficient memory cell for a static random access memory (SRAM), a memory array of memory cells and an area-efficient dual-port or multi-port SRAM.

BACKGROUND OF THE INVENTION

Static random access memories are widely used in integrated circuits and may account for a significant portion of the area and power consumption of the circuit. A typical memory cell of an SRAM memory is a six-transistor (6T) memory cell made up of six MOSFETs. Each bit is stored on four transistors that form two cross-coupled inverters. In addition to the four transistors, the two cross-coupled inverters are connected to a bit line and an inverted bit line through two further access transistors, which are controlled by a common word line in the standard single-port 6T SRAM cell. The transistors have to be properly sized to perform single read and write operations in a reliable way.

In the case of dual-port or multi-port SRAM, two transistors have to be added to the 6T memory cell for every additional required port. Hence, a conventional dual-port memory is implemented as an 8T memory cell. As can be realized, the advantages of having additional ports in SRAM comes with a cost, namely the increase in the number of transistors, which in turn means an increase in manufacturing cost due to larger area of the chip. Apart from increase in area, dual-port SRAMs have higher power consumption than single port SRAM. These disadvantages often outweigh the advantages of using dual-port SRAM.

Attempts have been made to address the aforementioned disadvantages by designing new memory cells. However, these approaches are typically not portable for different technology nodes and may be associated with a number of fabrication challenges. Most of the previous works to emulate dual-port functionality using 6T-bitcell is based on time-multiplexing. In this regard, time-multiplex represents approaches wherein the 6T-bitcell has been accessed by a scheduling scheme or delay scheme which schedules two sequential read/write operations in a single clock cycle. This is analogous to performing two operations in a faster single-port SRAM and allocating data to two different ports.

SUMMARY OF THE INVENTION

It is an aim of the present disclosure to provide an area-efficient static random access memory and a memory cell for a static random access memory, wherein a 6T memory cell can be used in a dual-port SRAM. The present disclosure relates to, in a first embodiment, a memory cell for a static random access memory, the memory cell comprising:

a first transistor (M1), a second transistor (M2), a third transistor (M3) and a fourth transistor (M4) forming first and second cross-coupled inverters (INV1, INV2), wherein the first and second cross-coupled inverters (INV1, INV2) define a first storage node (D) and an inverted first storage node (D'), wherein the first inverter (INV1) is connected to a first reference voltage (GND1) and a first supply voltage (VDD1), and wherein the second inverter (INV2) is connected to a second reference voltage (GND2) and a second supply voltage (VDD2);

a fifth transistor (M5) connected between the first storage node (D) and a first bit line (BL1);

a sixth transistor (M6) connected between the inverted first storage node (D') and a second bit line (BL2);

a first word line (WL1) connected to the fifth transistor (M5), said first word line (WL1) controlling the access of the first bit line (BL1) to the first storage node (D); and a second word line (WL2), independent of the first word line (WL1), connected to the sixth transistor (M6), said second word line (WL2) controlling the access of the second bit line (BL2) to the inverted first storage node (D') independently of the first bit line (BL1);

wherein relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2), or of the first reference voltage (GND1) and the second reference voltage (GND2), or of the first bit line (BL1) and first reference voltage (GND1) or first supply voltage (VDD1), or of the second bit line (BL2) and second reference voltage (GND2) or second supply voltage (VDD2) are configured such that data of the first storage node (D) and the inverted first storage node (D') can be read and written independently.

Figure 1:
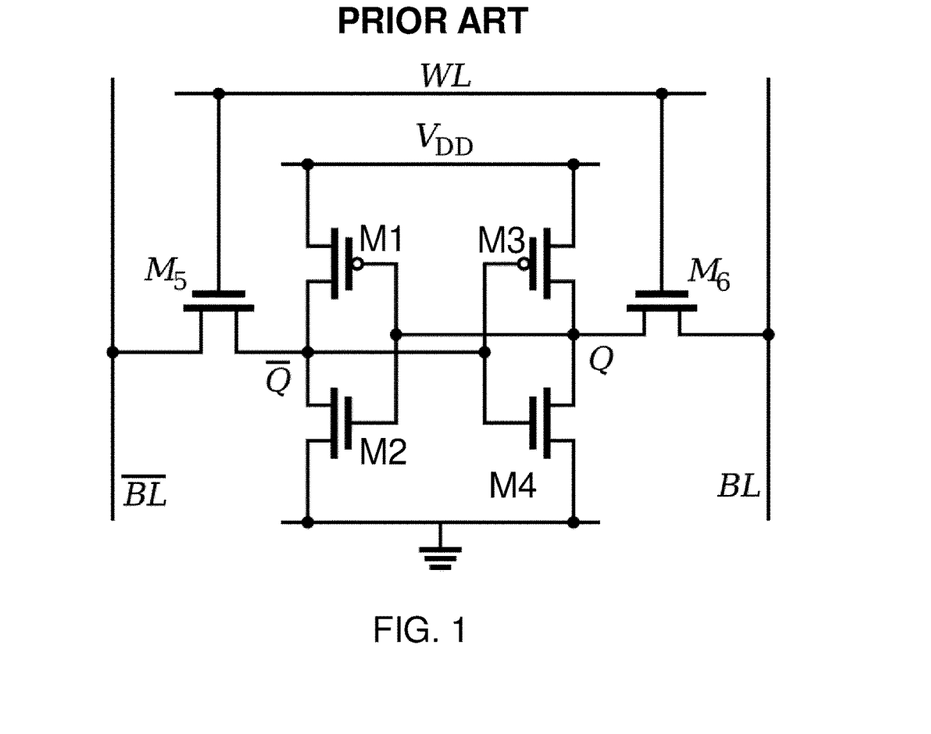
FIG. 1 shows a prior art memory cell for a static random access memory, wherein the WL and BL signals are dependent.

The inventors have realized that by breaking with the practice of using the pair of access transistors (M5, M6) dependently and instead access them independently, for both read and write accesses, a dual-port 6T memory cell can be obtained. In a conventional 6T design as shown in FIG. 1, a write operation, in particular the operation of writing a logical '1', is challenging. A '1' is written by pushing complementary inverted values on BL and $\overline{BL}$. WL is then asserted. The sizes of the transistors are designed such that the value that is latched in overrides the previous state of the cross-coupled inverters. In practice, access NMOS transistors M5 and M6 have to be stronger than either bottom NMOS (M2, M4) or top PMOS (M1, M3) transistors to override the previous state of the inverters. Sizing of the inverters may be challenging. Careful sizing of the transistors in an SRAM cell is needed to ensure proper operation. Typically, the objective is to minimize the transistors while maintaining as fast and reliable read and write as possible. In order to write '1' in a reliable manner, complementary inverted values have previously therefore been latched to both BL and $\overline{BL}$. In the presently disclosed memory cell and corresponding memory, the relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2) may instead by handled dynamically by increasing or decreasing one or more of the individual reference levels, such the value can be written from only one side. Moreover, the bit line being accessed may be boosted, preferably in combination with the dynamic handling of the mentioned relative voltage levels, in order to force the value stored in the cross-coupled inverters. It may be an advantage to boost the voltage of the first bit line (BL1) to a level significantly higher than VDD1, for example to a level of at least two times, or at least 2.5 times, or at least 3 times the first supply voltage (VDD1) during a write access. Similarly the second bit line (BL2) may be boosted to a level of at least two times, or at least 2.5 times, or at least 3 times the first supply voltage (VDD2) during a write access. This may be combined with boosting of the first and second word lines, which is explained in further detail below. In one embodiment, both the bit line and the word line of a port may be boosted simultaneously. According to one embodiment, a first word line voltage of the first word line (WL1) is boosted, such as boosted to a level of at least two times the first supply voltage (VDD1), and a first bit line voltage of the first bit line (BL1) is boosted, such as boosted to a level of at least two times the first supply voltage (VDD1) during a write access of the first storage node (D). Similarly, a second word line voltage of the second word line (WL2) may be boosted, such as boosted to a level of at least two times the first supply voltage (VDD2), and a second bit line voltage of the second bit line (BL2) may be boosted, such as boosted to a level of at least two times the second supply voltage (VDD2) during a write access of the second storage node (D'). By boosting both the bit line and word line an efficient access from one side can be achieved. The technique can be repeated on a third and fourth port, i.e. boosting a third word line (WL3) and a third bit line (BL3) simultaneously, and boosting a fourth word line (WL4) and a fourth bit line (BL4) simultaneously, and so forth.

In order to use the area-efficient memory cell in memory structure, the memory cells may be arranged in the form of an array of cells, such as m*n cells. Instead of having a dependency between first bit line (BL1) and the second bit line (BL2) (conventionally BL and $\overline{BL}$) for the access of a bit cell the bit lines may be fully independent for both read and write access. Thereby a dual-port 6T memory cell may be obtained. In the same way, instead of having a dependency between first word line (WL1) and the second word line (WL2) (conventionally the same WL is used for a bit cell) the word lines may be fully independent for both read and write access. The present disclosure therefore relates, in a further embodiment, to a static random access memory comprising:
- a plurality of memory cells as described in the present disclosure—a person skilled in the art would appreciate that different embodiments can be used;
- a row decoder;
- a column decoder;
- sense amplifiers;
- a voltage supply controller for providing voltages for the supply voltages, reference voltages, word lines and bit lines of the memory cells.

Typically the random access memory will comprise a number of address and data ports, and typically read and write enable ports. An address decoder (i.e. the row and column decoders) generates signals for the bit lines and word lines to the array of memory cells.

Moreover, the static random access memory may comprise a boost unit for providing voltage levels to each of the first reference voltage (GND1), the second reference voltage (GND2), the first supply voltage (VDD1), and the second supply voltage (VDD2), the first bit line (BL1), the second bit line (BL2), the first word line (WL1), and the second word line (WL2). Preferably, the boost unit is configured such that relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2) of each memory cell are configured such that data of the first storage node (D) and the inverted first storage node (D') can be read and written independently.

Figure 3:
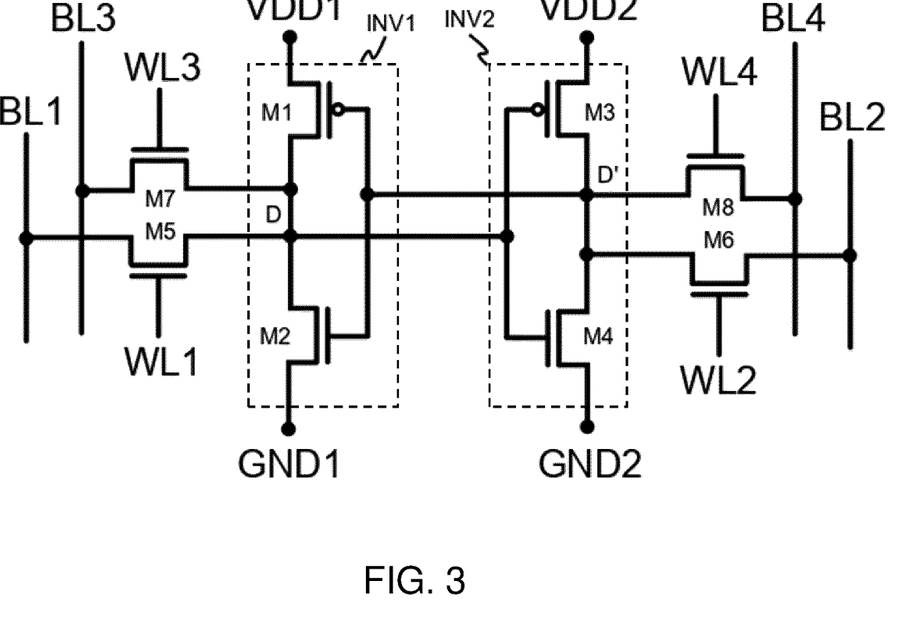
FIG. 3 shows an example of the presently disclosed memory cell for a static random access memory, in the form of an 8T four-port memory cell.

The presently disclosed concept may be extended to memories having more than two ports. For example, if a true dual port random access memory (allowing independent read and write) can be implemented using six transistors, a four-port random access memory can also be implemented using eight transistors, as shown in FIG. 3.

These and other aspects of the invention are set forth in the following detailed description of the invention.

DETAILED DESCRIPTION OF THE INVENTION

The present disclosure relates to a static random access memory comprising an array of memory cells, wherein the memory cells comprise: a first transistor (M1), a second transistor (M2), a third transistor (M3) and a fourth transistor (M4) forming first and second cross-coupled inverters (INV1, INV2), wherein the first and second cross-coupled inverters (INV1, INV2) define a first storage node (D) and an inverted first storage node (D'), wherein the first inverter (INV1) is connected to a first reference voltage (GND1) and a first supply voltage (VDD1), and wherein the second inverter (INV2) is connected to a second reference voltage (GND2) and a second supply voltage (VDD2). The memory cell may further comprise a fifth transistor (M5) connected between the first storage node (D) and a first bit line (BL1) for accessing the first storage node (D). The memory cell may further comprise a sixth transistor (M6) connected between the inverted first storage node (D') and a second bit line (BL2) for accessing the inverted first storage node (D'). Preferably, a first word line (WL1) is connected to the fifth transistor (M5), wherein said first word line (WL1) controls the access of the first bit line (BL1) to the first storage node (D). Similarly, a second word line (WL2), independent of the first word line (WL1), may be connected to the sixth transistor (M6), wherein said second word line (WL2) controls the access of the second bit line (BL2) to the inverted first storage node (D') independently of the first bit line (BL1). In order to allow independent use of the word lines and bit lines, the memory may further comprise a voltage supply controller, preferably comprising a voltage boost unit, for proving voltages for the supply voltages (VDD1, VDD2), reference voltages (GND1, GND2), word lines and bit lines of the memory cells. Preferably, the voltage supply controller is configured such that relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2), or of the first reference voltage (GND1) and the second reference voltage (GND2) are configured such that data of the first storage node (D) and the inverted first storage node (D') can be read and written independently.

Figure 5:
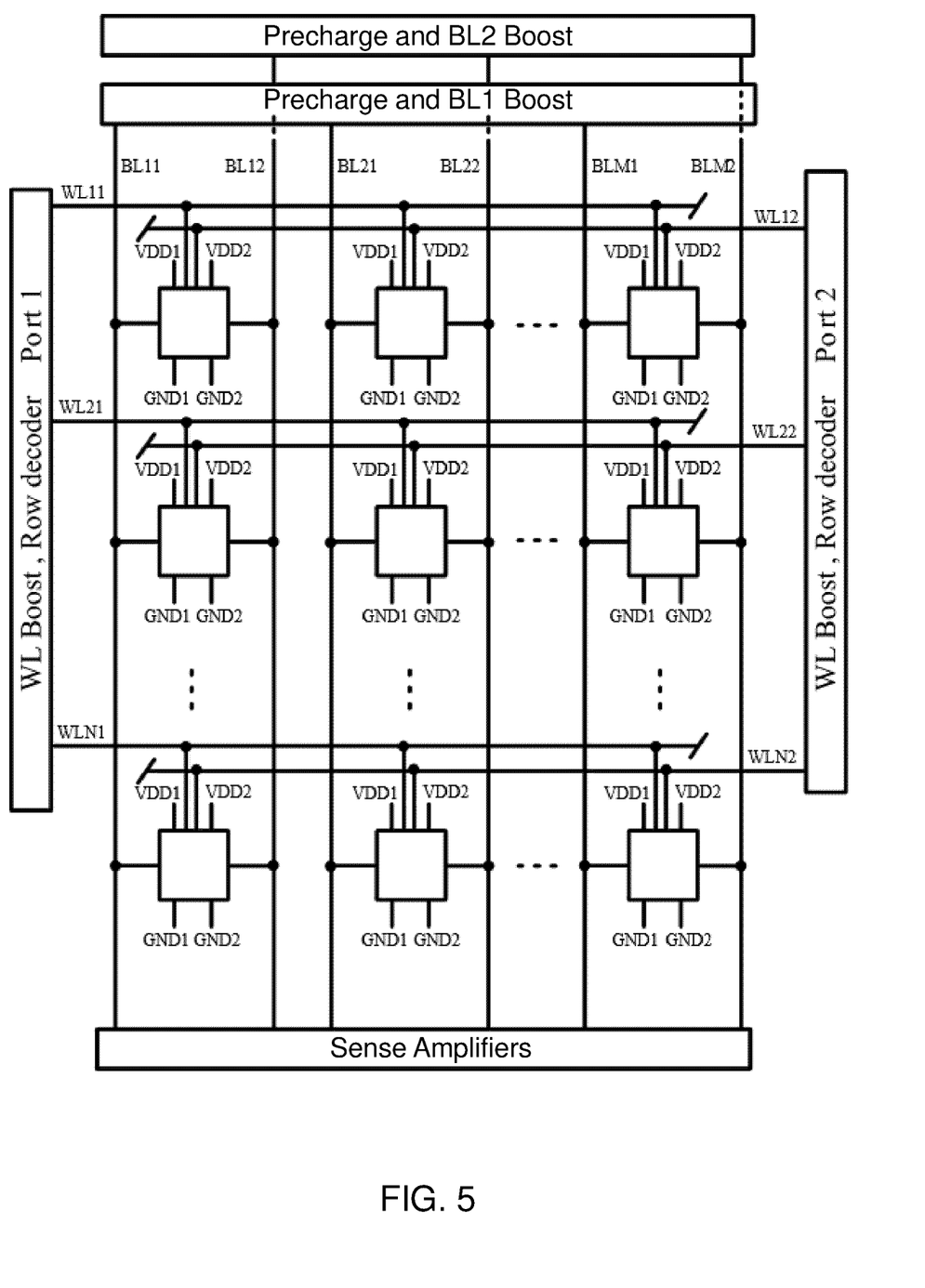
FIG. 5 shows an example of the presently disclosed static random access memory comprising an array of memory cells, wherein the bit lines and word lines of the memory cells are independent of each other.

The static random access memory may further comprise a row decoder for accessing rows (word lines) of the memory based on logical values on the ports of the memory. The row decoder may accordingly use a word line boost unit in order to boost the voltage of the accessed word line. The static random access memory may further comprise a column decoder for accessing columns (bit lines) of the memory based on logical values on the ports of the memory. The column decoder may accordingly use a bit line boost unit in order to boost the voltage of the accessed bit line. In the example of FIG. 5, the bit lines BL11 and BL12 (and BL21 and BL22 and so forth) may be independently accessed. This is possible because of the possibility to configure the relative voltages of for example the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2), or of the first reference voltage (GND1) and the second reference voltage (GND2). Similarly, the word lines WL11 and WL12 (and WL21 and WL22 and so forth) may be independently accessed. The row decoder may accordingly use a word line boost unit in order to boost the voltage of the accessed word line. The voltage supply controller may be further arranged to provide voltages for the GND1 and GND2 voltages of the memory cells.

The static random access memory may further comprise sense amplifiers, precharge circuitry and any other peripheral memory logic. The voltage supply controller may comprise a boost unit for providing voltage levels to first reference voltage (GND1) and/or the second reference voltage (GND2) and/or the first supply voltage (VDD1) and/or the second supply voltage (VDD2) and/or the first bit line (BL1) and/or the second bit line (BL2) and/or the first word line (WL1) and/or the second word line (WL2) of the memory cells.

By controlling the relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2), the first storage node (D) and an inverted first storage node (D') can be accessed from only one side. In the example of FIG. 5 it may, for example, be possible to use a first port of a dual-port memory for reading or writing one of the memory cells in the left column by accessing BL11, while a second port can read or write another memory cell by accessing BL12. The first supply voltage (VDD1), second supply voltage (VDD2), first bit line (BL1), first word line (WL1), second bit line (BL2) and second word line (WL2) may be separate voltages which are controlled independently of each other. The first reference voltage (GND1) and the second reference voltage (GND2) may also be separate voltages controlled independently of each other.

A dual-port memory can be defined as a memory which allows multiple read or writes on the two ports occurring at the same time, or nearly the same time. A "true" dual-port memory is sometimes referred to as a memory in which simultaneous access to a shared array of memory cells from each port is possible. The presently disclosed static random access memory may have a first bidirectional port or a first unidirectional port and a second bidirectional port or a second unidirectional port (in the case of a dual-port memory). The ports may include any necessary configuration of data-, address-, enable- and clock ports. The memory cells of the presently disclosed dual-port SRAM may be 6T SRAM dual-port memory cells. In contrast to prior art solutions, in which internal faster clock signals are used to read or write multiple times, the presently disclosed memory may be a static random access memory with an array of 6T SRAM dual-port memory cells being 6T SRAM single cycle dual-port memory cells.

Each memory cell of the presently static random access memory may comprise:
- a first transistor (M1), a second transistor (M2), a third transistor (M3) and a fourth transistor (M4) forming first and second cross-coupled inverters (INV1, INV2), wherein the first and second cross-coupled inverters (INV1, INV2) define a first storage node (D) and an inverted first storage node (D'), wherein the first inverter (INV1) is connected to a first reference voltage (GND1) and a first supply voltage (VDD1), and wherein the second inverter (INV2) is connected to a second reference voltage (GND2) and a second supply voltage (VDD2);
- a fifth transistor (M5) connected between the first storage node (D) and a first bit line (BL1);
- a first word line (WL1) connected to the fifth transistor (M5), said first word line (WL1) controlling the access of the first bit line (BL1) to the first storage node (D); and wherein relative voltage levels of the first word line (WL1) and first reference voltage (GND1), or of the first supply voltage (VDD1) and the first reference voltage (GND1), or of the second supply voltage (VDD2) and the second reference voltage (GND2), or of the first reference voltage (GND1) and the second reference voltage (GND2) are configured such that data of the first storage node (D) and the inverted first storage node (D') can be read and written independently.

The memory cell may further comprise:
- a sixth transistor (M6) connected between the inverted first storage node (D') and a second bit line (BL2); and
- a second word line (WL2), independent of the first word line (WL1), connected to the sixth transistor (M6), said second word line (WL2) controlling the access of the second bit line (BL2) to the inverted first storage node (D') independently of the first bit line (BL1);

Relative voltage levels of the second word line (WL2) and second reference voltage (GND2) may accordingly also be configured such that data of the first storage node (D) and the inverted first storage node (D') can be read and written independently.

Boost Circuitry

Figure 4:
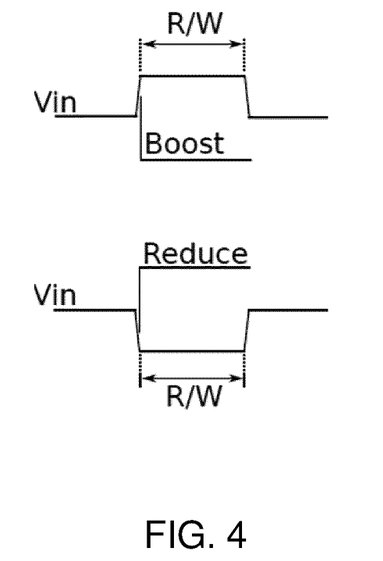
FIG. 4 shows examples of boosted (increased) voltage level during a read or write access and reduced voltage level during a read or write access.

The presently disclosed static random access memory may comprise a voltage supply controller for providing voltages for the supply voltages, reference voltages, word lines and bit lines of the memory cell. The voltage supply controller may be configured to control combinations of voltages of the first word line (WL1), the second word line (WL2), the first reference voltage (GND1), the second reference voltage (GND2), the first supply voltage (VDD1), the second supply voltage (VDD2), the first bit line (BL) and the second bit line (BL2) of the memory cells of the memory. Voltages may both be boosted and reduced independently in order to enable efficient reading and writing of the memory cells. Preferably, the voltage supply controller is dynamic in the sense that the voltages may be boosted or reduced during the access cycles, as shown in FIG. 4.

In order to boost one or several voltages, the memory may comprise boost circuitry. The boost circuitry may be a central unit or sub-units customized for any individual signals of the first word line (WL1), the second word line (WL2), the first reference voltage (GND1), the second reference voltage (GND2), the first supply voltage (VDD1), the second supply voltage (VDD2), the first bit line (BL) and the second bit line (BL2) of the memory cells of the memory. An example can be seen in FIG. 5, wherein there are two separate bit line boost units for the BL1 and BL2 bit lines and two word line boost units (one for each port). In one embodiment a boost unit is configured to provide voltage levels to the first bit line (BL1), the second bit line (BL2), the first word line (WL1) and the second word line (WL2).

Figure 6:
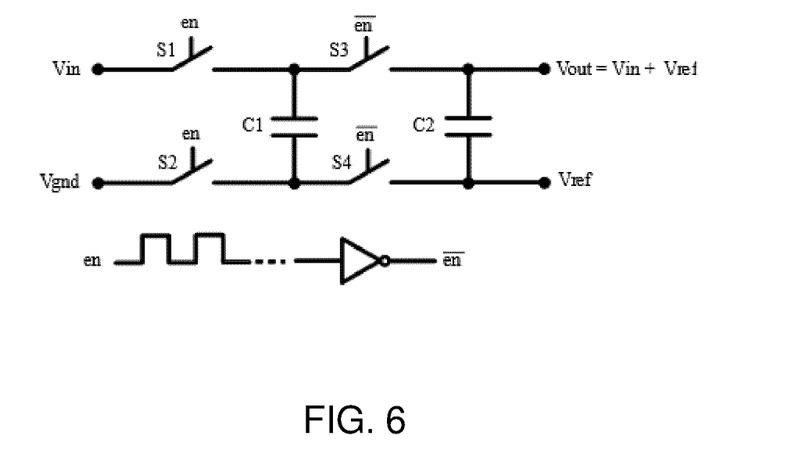
FIG. 6 shows an example of a boost unit.

The boost unit(s) may be implemented in several ways. In one embodiment, the boost unit comprises a plurality of charge pump circuits for providing individual voltages to any combination of first reference voltage (GND1), the second reference voltage (GND2), the first supply voltage (VDD1), and the second supply voltage (VDD2), the first bit line (BL1), the second bit line (BL2), the first word line (WL1), and the second word line (WL2), or any further bit line or word line. At least one of the charge pump units may comprise four cross coupled transistors and two capacitors for providing boosted voltages. An example of a charge pump based boost unit is shown in FIG. 6.

In one embodiment of the presently disclosed static random access memory, the boost unit is configured to boost a first word line voltage during a write access of the first storage node (D). The boost unit may be configured to provide a first word line voltage of the first word line (WL1) that is at least doubled or boosted to a level of at least two times, preferably at least 2.5 times, even more preferably at least 3 times, the first supply voltage (VDD1) during a write access of the first storage node (D). The boost unit may be further configured to provide a first bit line voltage of the first bit line (BL1) that is at least doubled or boosted to a level of at least two times, preferably at least 2.5 times, even more preferably at least 3 times, the first supply voltage (VDD1) during a write access of the first storage node (D)

In one embodiment of the presently disclosed static random access memory, the boost unit is configured to boost a second word line voltage during a write access of the inverted first storage node (D'). The boost unit may be configured to provide a second word line voltage of the second word line (WL2) that is at least doubled or boosted to a level of at least two times, preferably at least 2.5 times, even more preferably at least 3 times, the second supply voltage (VDD2) during a write access of the inverted first storage node (D'). The boost unit may be further configured to provide a second bit line voltage of the second bit line (BL2) is at least doubled or boosted to a level of at least two times, preferably at least 2.5 times, even more preferably at least 3 times, the second supply voltage (VDD2) during a write access of the inverted first storage node (D').

Signals may also be boosted and/or reduced to improve read accesses. Therefore, in one embodiment of the presently disclosed static random access memory, the boost unit is configured to provide a first bit line voltage of the first bit line (BL1) that is reduced during a read access of the first storage node (D). The boost unit may be further configured to provide a second bit line voltage of the second bit line (BL2) that is reduced during a read access of the inverted first storage node (D').

Figure 7:
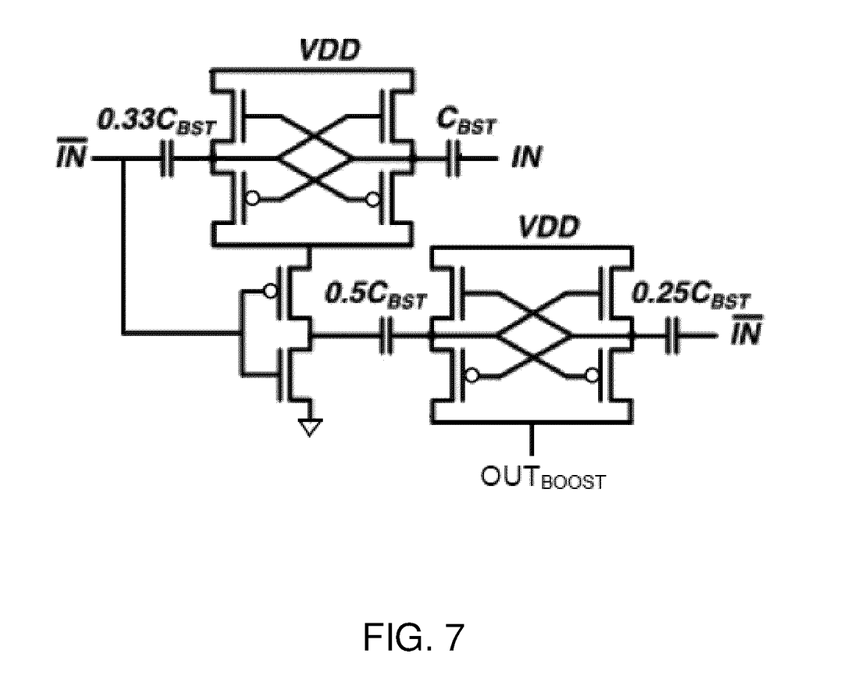
FIG. 7 shows an example of a boost unit configured to provide 2*VDD in a single cycle.

Since reading and writing to/from the memory cells of the memory may have to be done in a single clock cycle, the boost unit may be implemented to provide boosted voltages, even significantly boosted voltages, in a single cycle. FIG. 7 shows an example of a boost circuit configured to provide 2 VDD in single clock cycle. The boost circuit comprises two charge pumps, each charge pump comprising four cross coupled transistors and two capacitors. The four cross coupled transistors in each charge pump comprises 2 NMOS transistors connected to a supply voltage VDD, and two PMOS transistors connected to the NMOS transistors and to the output of the CP unit. Each charge pump unit is arranged for receiving a clock signal IN and a 180 degrees phase shifted version of the clock signal via the two capacitors. As the person skilled in the art would recognized, variants of this architecture would be envisageable.

Figure 8:
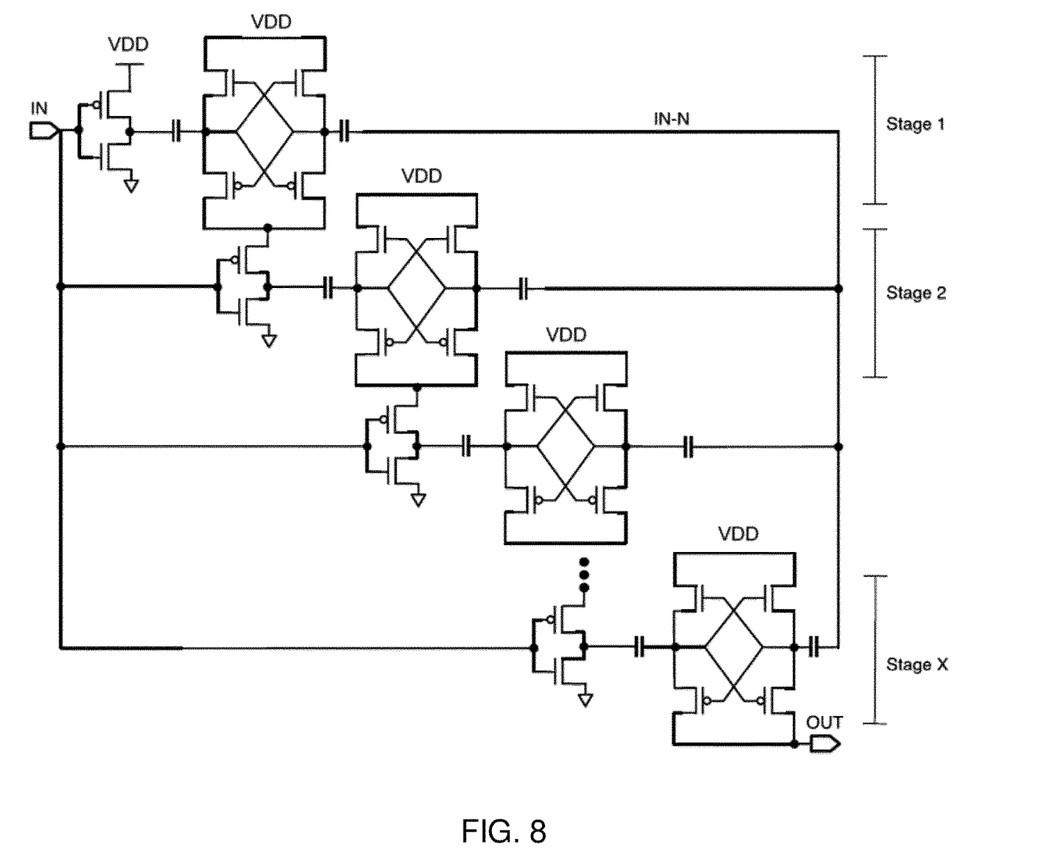
FIG. 8 shows an example of a boost unit configured to provide X*VDD in a single cycle.

It may be a further advantage to further increase some of the boosted voltage levels. Therefore, the presently disclosed static random access memory may comprise a boost unit capable of generating even higher voltages in a single clock cycle. An example of such a boost circuit is shown in FIG. 8. The boost circuit of FIG. 8 employs X number of stages. The output OUT of such boost circuit is thus X times VDD.

Dynamic Configurations of Voltage Level

In the presently disclosed memory cell and corresponding memory, the relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2) may be handled dynamically by increasing or decreasing one or more of the individual reference levels, such the value can be written from only one side. The word lines and bit lines may by fully independent in the sense that there is not as common WL as in the prior art (FIG. 1), but instead separate WL1 and WL2 signals associated with different ports of the memory, and the BL and BL signals are not dependent as in the prior art (FIG. 1), but instead separate BL1 and BL2 signals associated with different ports of the memory. The presently disclosed static random access memory may therefore be a true dual-port 6T memory.

In one embodiment of the presently disclosed memory cell and static random access memory, the first supply voltage (VDD1) is reduced during a write access of the first storage node (D). The second supply voltage (VDD2) may be reduced during a write access of the inverted first storage node (D').

Alternatively, or in combination, the first reference voltage (GND1) may be boosted during a write access of the first storage node (D). The second reference voltage (GND2) may be boosted during a write access of the inverted first storage node (D').

In a further embodiment of the presently disclosed memory cell and static random access memory the first supply voltage (VDD1) is reduced and the first reference voltage (GND1) is boosted during a write access of the first storage node (D). The second supply voltage (VDD2) is reduced and the second reference voltage (GND2) is boosted during a write access of the inverted first storage node (D').

The second supply voltage (VDD2) may also be reduced during a write access of the first storage node (D). The first supply voltage (VDD1) may be reduced during a write access of the inverted first storage node (D'). The second reference voltage (GND2) may be reduced during a write access of the first storage node (D). The first reference voltage (GND1) is reduced during a write access of the inverted first storage node (D').

In one embodiment, both reference voltages (GND1 and GND2) are changed at the same time. Preferably, one of the reference voltages is decreased while the other is increased. In one embodiment, the first reference voltage (GND1) is boosted and the second reference voltage (GND2) is reduced during a write access of the first storage node (D). The first reference voltage (GND1) may alternatively, or in combination, be reduced and the second reference voltage (GND2) boosted during a write access of the inverted first storage node (D').

In a conventional 6T design as shown in FIG. 1, a write operation, in particular the operation of writing a logical '1', is challenging. A '1' is conventionally written by pushing complementary inverted values on BL and BL while WL is asserted. In the presently disclosed memory cell and static random access memory a write access may comprise the process of writing any value (logical "0" or "1") to the first storage node (D) or the inverted first storage node (D'). In particular the write access may include process of writing a logical "1" to the first storage node (D) or the inverted first storage node (D') by applying the teachings described herein.

It is also possible to boost and/or reduce relative voltage levels of for example the first word line (WL1) and first reference voltage (GND1), or of the first supply voltage (VDD1) and the first reference voltage (GND1), or of the second supply voltage (VDD2) and the second reference voltage (GND2), or of the first reference voltage (GND1) and the second reference voltage (GND2) when values are read from the first storage node (D) or the inverted first storage node (D').

In one embodiment a word line voltage is reduced during a read access of the storage node controlled by the word line. The first word line voltage of the first word line (WL1) may be reduced during a read access of the first storage node (D). The second word line voltage of the second word line (WL2) may be reduced during a read access of the inverted first storage node (D').

Moreover, levels of the supply voltages (VDD1, VDD2) and/or the reference voltages (GND1, GND2) may be increased or decreased in order to enable independent control and access of the storage nodes. In one embodiment, the first supply voltage (VDD1) is boosted during a read access of the first storage node (D). In one embodiment, the first reference voltage (GND1) is reduced during a read access of the first storage node (D). The combination is also possible i.e. the first supply voltage (VDD1) is boosted and the first reference voltage (GND1) is reduced during a read access of the first storage node (D). The same may be applied to the inverted first storage node (D'). Therefore, in one embodiment, the second supply voltage (VDD2) is boosted during a read access of the inverted first storage node (D'). In one embodiment, the second reference voltage (GND2) is reduced during a read access of the inverted first storage node (D'). The combination is also possible i.e. the second supply voltage (VDD2) is boosted and the second reference voltage (GND2) is reduced during a read access of the inverted first storage node (D').

The inventors have also found that it may be useful to adjust levels of the supply voltages and reference voltages of the opposite side of the cross-coupled inverters, i.e. adjusting voltages VDD1 and/or GND1 during an access of the inverted first storage node (D') and adjusting voltages VDD2 and/or GND2 during an access of the first storage node (D). In one embodiment, the second supply voltage (VDD2) is boosted during a read access of the first storage node (D). In one embodiment, the second reference voltage (GND2) is boosted during a read access of the first storage node (D). In one embodiment, the first supply voltage (VDD1) is boosted during a read access of the inverted first storage node (D'). In one embodiment, the first reference voltage (GND1) is boosted during a read access of the inverted first storage node (D').

Multi-Port Static Random Access Memory

The present disclosure further relates to a multi-port static random access memory and memory cell for a static random access memory. The static random access memory is not necessarily limited to a single-port 5T static random access memory and a 6T dual-port static random access memory. The presently disclosed memory cell may accordingly to further comprise:
- a seventh transistor (M7) connected between the first storage node (D) and a third bit line (BL3);
- optionally, an eighth transistor (M8) connected between the inverted first storage node (D') and a fourth bit line (BL4);
- a third word line (WL3) connected to the seventh transistor (M7), said third word line (WL3) controlling the access of the third bit line (BL3) to the first storage node (D), preferably independently of the first and second bit lines (BL1, BL2); and
- optionally, a fourth word line (WL4), independent of the first, second and third word lines (WL1, WL2, WL3), connected to the eighth transistor (M8), said fourth word line (WL4) controlling the access of the fourth bit line (BL4) to the inverted first storage node (D') independently of the first, second and third bit lines (BL1, BL2, BL3).

The memory cell and memory may thereby be a 7T SRAM three-port memory cell/memory or an 8T SRAM four-port memory cell/memory.

Preferably, relative voltage levels of the third word line (WL3) and first reference voltage (GND1), or of the first supply voltage (VDD1) and the first reference voltage (GND1), or of the fourth word line (WL4) and second reference voltage (GND2), or of the second supply voltage (VDD2) and the second reference voltage (GND2) are configured such that data of the first storage node (D) and the inverted first storage node (D') can be read and written independently from/to the third and/or fourth bit lines (BL3, BL4), respectively.

The concept may be further extended to an m+n port memory and memory cell. The memory cell/memory may accordingly further comprise:

m left side access transistors connected between the first storage node (D) and m corresponding left side access bit lines;
n right side access transistors connected between the inverted first storage node (D) and n corresponding right side access bit lines;
m left side access word lines connected to m left side access transistors; and
n right side access word lines connected to n right side access transistors, wherein the data of the first storage node (D) and the inverted first storage node (D') can be read and written from/to the m left side access bit lines and n right side access bit lines independently.

The memory cell may thereby be an SRAM memory cell having (4+m+n) ports, such as unidirectional ports or bidirectional ports, implemented with (8+m+n) transistors.

DETAILED DESCRIPTION OF THE DRAWINGS

The invention will in the following be described in greater detail with reference to the accompanying drawings. The drawings are exemplary and are intended to illustrate some of the features of the presently disclosed static random access memory and memory cell for a static random access memory, and are not to be construed as limiting to the presently disclosed invention.

FIG. 1 shows a prior art memory cell for a static random access memory, wherein the WL and BL signals are dependent. A common WL is used and the values of BL and BL are complementary inverted.

Figure 2:
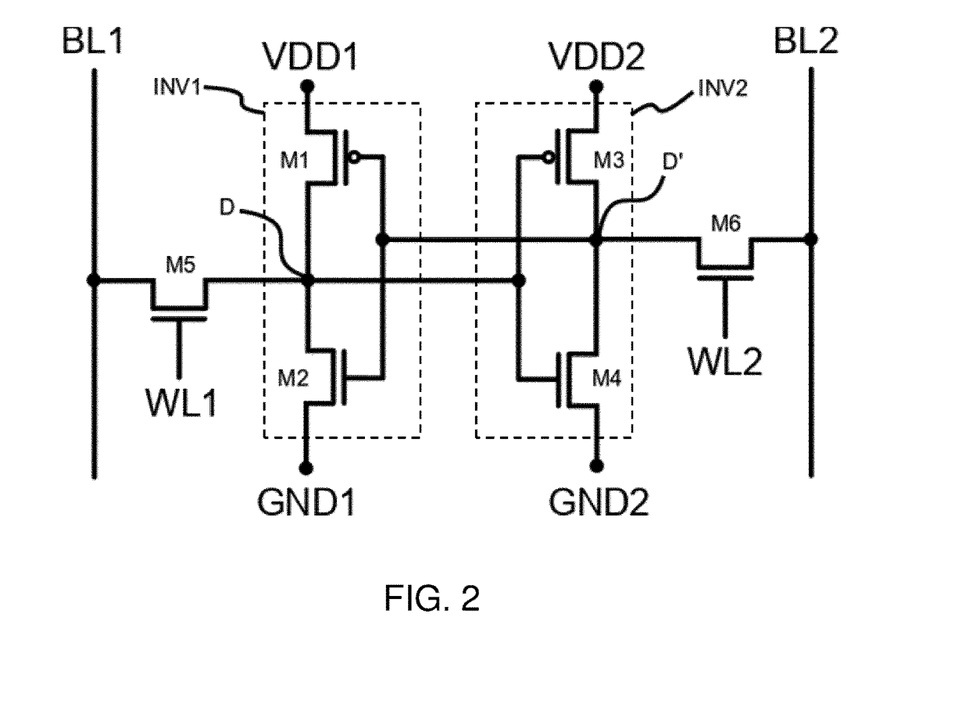
FIG. 2 shows an example of the presently disclosed memory cell for a static random access memory, in the form of a 6T dual-port memory cell.

FIG. 2 shows an example of the presently disclosed memory cell for a static random access memory, in the form of a 6T dual-port memory cell. The memory cell has a first (PMOS) transistor (M1), a second (NMOS) transistor (M2), a third (PMOS) transistor (M3) and a fourth (NMOS) transistor (M4) forming first and second cross-coupled inverters (INV1, INV2). A fifth (NMOS) transistor (M5) is connected between the first storage node (D) and a first bit line (BL1). A sixth (NMOS) transistor (M6) is connected between the inverted first storage node (D') and a second bit line (BL2). A first word line (WL1) is connected to (the gate terminal of) the fifth transistor (M5), controlling the access of the first bit line (BL1) to the first storage node (D). A second word line (WL2) is connected to (the gate terminal of) the sixth transistor (M6) controlling the access of the second bit line (BL2) to the inverted first storage node (D'). BL1 and WL1 are independent of BL2 and WL2, which means that two different ports can be used to accessed D and D'. Voltages VDD1, VDD2, GND1 and GND2 may be separately controlled, and relative voltage levels of BL1, WL1, VDD1, GND1, BL2, WL2, VDD2, and GND2 may be applied to allow for independent write and read accesses of the D and D'.

FIG. 3 shows an example of the presently disclosed memory cell for a static random access memory, in the form of an 8T four-port memory cell. The memory cell has a first transistor (M1), a second transistor (M2), a third transistor (M3) and a fourth transistor (M4) forming first and second cross-coupled inverters (INV1, INV2). A fifth transistor (M5) is connected between the first storage node (D) and a first bit line (BL1). A sixth transistor (M6) is connected between the inverted first storage node (D') and a second bit line (BL2). A seventh transistor (M7) is connected between the first storage node (D) and a third bit line (BL3). An eighth transistor (M8) is connected between the inverted first storage node (D') and a fourth bit line (BL4). A first word line (WL1) is connected to the fifth transistor (M5), controlling the access of the first bit line (BL1) to the first storage node (D). A second word line (WL2) is connected to the sixth transistor (M6) controlling the access of the second bit line (BL2) to the inverted first storage node (D'). A third word line (WL3) is connected to the seventh transistor (M7), controlling the access of the third bit line (BL3) to the first storage node (D). A fourth word line (WL4) is connected to the eighth transistor (M8) controlling the access of the fourth bit line (BL4) to the inverted first storage node (D'). All BL-WL pairs (BL1, WL1, BL2, WL2, BL3, WL3, BL4, WL4) are independent of each other, which means that four different ports can be used to accessed D and D'. Voltages VDD1, VDD2, GND1 and GND2 may be separately controlled, and relative voltage levels of BL1, WL1, BL3, WL3, VDD1, GND1, BL2, WL2, BL4, WL4, VDD2, and GND2 may be applied to allow for independent write and read accesses of the D and D'.

FIG. 4 shows examples of boosted (increased) voltage level during a read or write access and reduced voltage level during a read or write access. Vref may refer to any individual voltage level and intends to illustrate the concept of boosting or reducing a voltage level during a read/write access.

FIG. 5 shows an example of the presently disclosed static random access memory comprising an array of memory cells, wherein the bit lines and word lines of the memory cells are independent of each other. A first port of a dual-port memory may for example read or write one of the memory cells in the left column by accessing BL11, while a second port can read or write another memory cell in the left column by accessing BL12. In the example BL1 and BL2 have separate precharge and boost units. Similarly, a first port WL may have one WL boost unit, whereas a second port WL may have another WL boost unit. In the example, the memory includes sense amplifiers on the bit lines.

FIG. 6 shows an example of a boost unit in the form of two parallel capacitors $C_1$ and $C_2$ and four switches in an arrangement for providing a boosted output voltage. Other boost unit implementations are envisageable.

FIG. 7 shows an example of a boost unit configured to provide 2*VDD in a single cycle. The boost unit comprises a first and a second charge pump unit. Each charge pump unit comprises four cross coupled transistors and two capacitors. The four cross coupled transistors comprise 2 NMOS transistors connected to a supply voltage VDD, and two PMOS transistors connected to the NMOS transistors and to the output of the charge pump unit. Each charge pump unit is arranged for receiving a clock signal IN and a 180 degrees phase shifted version of the clock signal via the two capacitors. The charge pump units are connected in parallel, which means that the input of the second charge pump is connected to the output of the first charge pump through an inverter that is controlled by the clock signal. FIG. 8 shows an example of a boost unit configured to provide X*VDD in a single cycle, using an extension of the concept of FIG. 7.

Further Details of the Invention

1. A memory cell for a static random access memory, the memory cell comprising:
    a first transistor (M1), a second transistor (M2), a third transistor (M3) and a fourth transistor (M4) forming first and second cross-coupled inverters (INV1, INV2), wherein the first and second cross-coupled inverters (INV1, INV2) define a first storage node (D) and an inverted first storage node (D'), wherein the first inverter (INV1) is connected to a first reference voltage (GND1) and a first supply voltage (VDD1), and wherein the second inverter (INV2) is connected to a second reference voltage (GND2) and a second supply voltage (VDD2);

a fifth transistor (M5) connected between the first storage node (D) and a first bit line (BL1);

a sixth transistor (M6) connected between the inverted first storage node (D') and a second bit line (BL2);

a first word line (WL1) connected to the fifth transistor (M5), said first word line (WL1) controlling the access of the first bit line (BL1) to the first storage node (D); and a second word line (WL2), independent of the first word line (WL1), connected to the sixth transistor (M6), said second word line (WL2) controlling the access of the second bit line (BL2) to the inverted first storage node (D') independently of the first bit line (BL1);

wherein relative voltage levels of the first word line (WL1) and first reference voltage (GND1), or of the first supply voltage (VDD1) and the first reference voltage (GND1), or of the second word line (WL2) and second reference voltage (GND2), or of the second supply voltage (VDD2) and the second reference voltage (GND2), or of the first reference voltage (GND1) and the second reference voltage (GND2), or of the first bit line (BL1) and first reference voltage (GND1) or first supply voltage (VDD1), or of the second bit line (BL2) and second reference voltage (GND2) or second supply voltage (VDD2) are configured such that data of the first storage node (D) and the inverted first storage node (D') can be read and written independently.

2. The memory cell according to any of the preceding items, wherein a first word line voltage of the first word line (WL1) is at least doubled or boosted to a level of at least two times, preferably at least 2.5 times, even more preferably at least 3 times, the first supply voltage (VDD1) during a write access of the first storage node (D).

3. The memory cell according to item 2, wherein a first bit line voltage of the first bit line (BL1) is at least doubled or boosted to a level of at least two times, preferably at least 2.5 times, even more preferably at least 3 times, the first supply voltage (VDD1) during a write access of the first storage node (D).

4. The memory cell according to any of the preceding items, wherein a second word line voltage of the second word line (WL2) is at least doubled or boosted to a level of at least two times, preferably at least 2.5 times, even more preferably at least 3 times, the second supply voltage (VDD2) during a write access of the inverted first storage node (D').

5. The memory cell according to item 4, wherein a second bit line voltage of the second bit line (BL2) is at least doubled or boosted to a level of at least two times, preferably at least 2.5 times, even more preferably at least 3 times, the second supply voltage (VDD2) during a write access of the inverted first storage node (D').

6. The memory cell according to any of the preceding items, wherein the first supply voltage (VDD1) is reduced during a write access of the first storage node (D).

7. The memory cell according to any of the preceding items, wherein the second supply voltage (VDD2) is reduced during a write access of the inverted first storage node (D').

8. The memory cell according to any of the preceding items, wherein the first reference voltage (GND1) is boosted during a write access of the first storage node (D).

9. The memory cell according to any of the preceding items, wherein the second reference voltage (GND2) is boosted during a write access of the inverted first storage node (D').

10. The memory cell according to any of the preceding items, wherein the first supply voltage (VDD1) is reduced and the first reference voltage (GND1) is boosted during a write access of the first storage node (D).

11. The memory cell according to any of the preceding items, wherein the second supply voltage (VDD2) is reduced and the second reference voltage (GND2) is boosted during a write access of the inverted first storage node (D').

12. The memory cell according to any of the preceding items, wherein the second supply voltage (VDD2) is reduced during a write access of the first storage node (D).

13. The memory cell according to any of the preceding items, wherein the first supply voltage (VDD1) is reduced during a write access of the inverted first storage node (D').

14. The memory cell according to any of the preceding items, wherein the second reference voltage (GND2) is reduced during a write access of the first storage node (D).

15. The memory cell according to any of the preceding items, wherein the first reference voltage (GND1) is reduced during a write access of the inverted first storage node (D').

16. The memory cell according to any of the preceding items, wherein the first reference voltage (GND1) is boosted and the second reference voltage (GND2) is reduced during a write access of the first storage node (D).

17. The memory cell according to any of the preceding items, wherein the first reference voltage (GND1) is reduced and the second reference voltage (GND2) is boosted during a write access of the inverted first storage node (D').

18. The memory cell according to any of the preceding items, wherein the write access is the process of writing a logical "1" to the first storage node (D) or the inverted first storage node (D').

19. The memory cell according to any of the preceding items, wherein the first supply voltage (VDD1), second supply voltage (VDD2), first bit line (BL1), first word line (WL1), second bit line (BL2) and second word line (WL2) are separate voltages.

20. The memory cell according to item 19, wherein the first reference voltage (GND1) and the second reference voltage (GND2) are separate voltages.

21. The memory cell according to any of the preceding items, wherein the first word line voltage of the first word line (WL1) is reduced during a read access of the first storage node (D).

22. The memory cell according to any of the preceding items, wherein the second word line voltage of the second word line (WL2) is reduced during a read access of the inverted first storage node (D').

23. The memory cell according to any of the preceding items, wherein the first supply voltage (VDD1) is boosted during a read access of the first storage node (D).

24. The memory cell according to any of the preceding items, wherein the second supply voltage (VDD2) is boosted during a read access of the inverted first storage node (D').
25. The memory cell according to any of the preceding items, wherein the first reference voltage (GND1) is reduced during a read access of the first storage node (D).
26. The memory cell according to any of the preceding items, wherein the second reference voltage (GND2) is reduced during a read access of the inverted first storage node (D').
27. The memory cell according to any of the preceding items, wherein the first supply voltage (VDD1) is boosted and the first reference voltage (GND1) is reduced during a read access of the first storage node (D).
28. The memory cell according to any of the preceding items, wherein the second supply voltage (VDD2) is boosted and the second reference voltage (GND2) is reduced during a read access of the inverted first storage node (D').
29. The memory cell according to any of the preceding items, wherein the second supply voltage (VDD2) is boosted during a read access of the first storage node (D).
30. The memory cell according to any of the preceding items, wherein the first supply voltage (VDD1) is boosted during a read access of the inverted first storage node (D').
31. The memory cell according to any of the preceding items, wherein the second reference voltage (GND2) is boosted during a read access of the first storage node (D).
32. The memory cell according to any of the preceding items, wherein the first reference voltage (GND1) is boosted during a read access of the inverted first storage node (D').
33. The memory cell according to any of the preceding items, wherein the first bit line voltage of the first bit line (BL1) is reduced during a read access of the first storage node (D).
34. The memory cell according to any of the preceding items, wherein the second bit line voltage of the second bit line (BL2) is reduced during a read access of the inverted first storage node (D').
35. The memory cell according to any of the preceding items, wherein the first bit line (BL1) and the first word line (WL1) constitute a first bidirectional port or a first unidirectional port, and wherein the second bit line (BL2) and the second word line (WL2) constitute a second bidirectional port or a second unidirectional port.
36. The memory cell according to any of the preceding items, wherein the memory cell is a 6T SRAM dual-port memory cell.
37. The memory cell according to item 36, wherein the 6T SRAM dual-port memory cell is a 6T SRAM single cycle dual-port memory cell.
38. The memory cell according to any of items 1-35, further comprising:
    a seventh transistor (M7) connected between the first storage node (D) and a third bit line (BL3);
    an eighth transistor (M8) connected between the inverted first storage node (D') and a fourth bit line (BL4);
    a third word line (WL3) connected to the seventh transistor (M7), said third word line (WL3) controlling the access of the third bit line (BL3) to the first storage node (D); and
    a fourth word line (WL4), independent of the first, second and third word lines (WL1, WL2, WL3), connected to the eighth transistor (M8), said fourth word line (WL4) controlling the access of the fourth bit line (BL4) to the inverted first storage node (D') independently of the first, second and third bit lines (BL1, BL2, BL3).
39. The memory cell according to item 38, wherein relative voltage levels of the third word line (WL3) and first reference voltage (GND1), or of the first supply voltage (VDD1) and the first reference voltage (GND1), or of the fourth word line (WL4) and second reference voltage (GND2), or of the second supply voltage (VDD2) and the second reference voltage (GND2) are configured such that data of the first storage node (D) and the inverted first storage node (D') can be read and written independently from/to the third and fourth bit lines (BL3, BL4), respectively.
40. The memory cell according to any of items 38-39, wherein the memory cell is an 8T SRAM four-port memory cell.
41. The memory cell according to any of items 38-39, further comprising:
    m left side access transistors connected between the first storage node (D) and m corresponding left side access bit lines;
    n right side access transistors connected between the inverted first storage node (D) and n corresponding right side access bit lines;
    m left side access word lines connected to m left side access transistors; and
    n right side access word lines connected to n right side access transistors, wherein the data of the first storage node (D) and the inverted first storage node (D') can be read and written from/to the m left side access bit lines and n right side access bit lines independently.
42. The memory cell according to item 41, wherein the memory cell is an SRAM memory cell having (4+m+n) ports, such as unidirectional ports or bidirectional ports, implemented with (8+m+n) transistors.
43. A memory array comprising a plurality of memory cells according to any of items 1-42.
44. A static random access memory comprising:
    a plurality of memory cells according to any of items 1-42;
    a row decoder;
    a column decoder;
    sense amplifiers;
    a voltage supply controller for providing voltages for the supply voltages, reference voltages, word lines and bit lines of the memory cells.
45. The static random access memory according to item 44, further comprising:
    a boost unit for providing voltage levels to first reference voltage (GND1), the second reference voltage (GND2), the first supply voltage (VDD1), and the second supply voltage (VDD2).
46. The static random access memory according to item 45, wherein the boost unit is configured to provide voltage levels to the first bit line (BL1), the second bit line (BL2), the first word line (WL1), and the second word line (WL2).

47. The static random access memory according to any of items 45-46, wherein the boost unit comprises a plurality of charge pump circuits for providing individual voltages to any combination of first reference voltage (GND1), the second reference voltage (GND2), the first supply voltage (VDD1), and the second supply voltage (VDD2), the first bit line (BL1), the second bit line (BL2), the first word line (WL1), and the second word line (WL2), or any further bit line or word line.

48. The static random access memory according to any of items 45-47, wherein the static random access memory is a single-port 5T static random access memory, or a dual-port 6T static random access memory, or a three-port 7T static random access memory, or a four-port 8T static random access memory, or a five-port 9T static random access memory, or a six-port 10T static random access memory.

The invention claimed is:

1. A memory cell for a static random access memory, the memory cell comprising:
    a first transistor, a second transistor, a third transistor and a fourth transistor forming first and second cross-coupled inverters, wherein the first and second cross-coupled inverters define a first storage node and an inverted first storage node, wherein the first inverter is connected to a first reference voltage and a first supply voltage, and wherein the second inverter is connected to a second reference voltage and a second supply voltage;
    a fifth transistor connected between the first storage node and a first bit line;
    a sixth transistor connected between the inverted first storage node and a second bit line;
    a first word line connected to the fifth transistor, said first word line controlling the access of the first bit line to the first storage node; and
    a second word line, independent of the first word line, connected to the sixth transistor, said second word line controlling the access of the second bit line to the inverted first storage node independently of the first bit line;
    wherein relative voltage levels of the first word line and first reference voltage, or of the first supply voltage and the first reference voltage, or of the second word line and second reference voltage, or of the second supply voltage and the second reference voltage, or of the first reference voltage and the second reference voltage, or of the first bit line and first reference voltage or first supply voltage, or of the second bit line and second reference voltage or second supply voltage are configured such that data of the first storage node and the inverted first storage node can be read and written independently,
    wherein a first word line voltage of the first word line is boosted, such as boosted to a level of at least two times the first supply voltage, and wherein a first bit line voltage of the first bit line is boosted, such as boosted to a level of at least two times the first supply voltage during a write access of the first storage node,
    wherein a second word line voltage of the second word line is boosted, such as boosted to a level of at least two times the second supply voltage, and wherein a second bit line voltage of the second bit line is boosted, such as boosted to a level of at least two times the second supply voltage during a write access of the inverted first storage node, and
    wherein the write access is the process of writing a logical "1" to the first storage node or the inverted first storage node.

2. The memory cell according to claim 1, wherein a first word line voltage of the first word line is at least doubled or boosted to a level of at least two times, preferably at least 2.5 times, even more preferably at least 3 times, the first supply voltage during a write access of the first storage node, and/or wherein a second word line voltage of the second word line is at least doubled or boosted to a level of at least two times, preferably at least 2.5 times, even more preferably at least 3 times, the second supply voltage during a write access of the inverted first storage node.

3. The memory cell according to claim 1, wherein a first bit line voltage of the first bit line is at least doubled or boosted to a level of at least two times, preferably at least 2.5 times, even more preferably at least 3 times, the first supply voltage during a write access of the first storage node, and/or wherein a second bit line voltage of the second bit line is at least doubled or boosted to a level of at least two times, preferably at least 2.5 times, even more preferably at least 3 times, the second supply voltage during a write access of the inverted first storage node.

4. The memory cell according to claim 1, wherein the first supply voltage is reduced during a write access of the first storage node, and/or wherein the second supply voltage is reduced during a write access of the inverted first storage node.

5. The memory cell according to claim 1, wherein the first reference voltage is boosted during a write access of the first storage node, and/or wherein the second reference voltage is boosted during a write access of the inverted first storage node.

6. The memory cell according to claim 1, wherein the first supply voltage is reduced and the first reference voltage is boosted during a write access of the first storage node, and/or wherein the second supply voltage is reduced and the second reference voltage is boosted during a write access of the inverted first storage node.

7. The memory cell according to claim 1, wherein the second supply voltage is reduced during a write access of the first storage node, and/or wherein the first supply voltage is reduced during a write access of the inverted first storage node.

8. The memory cell according to claim 1, wherein the first word line voltage of the first word line is reduced during a read access of the first storage node, and/or wherein the second word line voltage of the second word line is reduced during a read access of the inverted first storage node.

9. The memory cell according to claim 1, wherein the first supply voltage is boosted during a read access of the first storage node, and/or wherein the second supply voltage is boosted during a read access of the inverted first storage node.

10. The memory cell according to claim 1, wherein the first bit line and the first word line constitute a first bidirectional port or a first unidirectional port, and wherein the second bit line and the second word line constitute a second bidirectional port or a second unidirectional port.

11. The memory cell according to claim 1, wherein the memory cell is a 6T SRAM dual-port memory cell, preferably wherein the 6T SRAM dual-port memory cell is a 6T SRAM single cycle dual-port memory cell.

12. A static random access memory comprising:
a plurality of memory cells according to claim 1;
a row decoder;
a column decoder;
sense amplifiers;
a voltage supply controller for providing voltages for the supply voltages, reference voltages, word lines and bit lines of the memory cells.

13. The static random access memory according to claim 12, further comprising:
a boost unit for providing voltage levels to first reference voltage, the second reference voltage, the first supply voltage, and the second supply voltage.

14. The static random access memory according to claim 13, wherein the boost unit is configured to provide voltage levels to the first bit line, the second bit line, the first word line, and the second word line.

15. The static random access memory according to claim 13, wherein the boost unit comprises a plurality of charge pump circuits for providing individual voltages to any combination of first reference voltage, the second reference voltage, the first supply voltage, and the second supply voltage, the first bit line, the second bit line, the first word line, and the second word line, or any further bit line or word line.

* * * * *